United States Patent
Ranieri et al.

(10) Patent No.: US 6,437,606 B1
(45) Date of Patent: Aug. 20, 2002

(54) METHOD OF ANOMALOUS OFFSET DETECTION AND A CORRESPONDING CIRCUIT

(75) Inventors: Danilo Ranieri, Sesto San Giovanni; Davide Brambilla, Rho; Edoardo Botti, Vigevano; Luca Celant, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 62 days.

(21) Appl. No.: 09/687,145

(22) Filed: Oct. 13, 2000

(30) Foreign Application Priority Data

Oct. 15, 1999 (EP) .............................................. 99830653

(51) Int. Cl.[7] .................................................. H03K 5/22
(52) U.S. Cl. .............................. 327/74; 327/77; 327/64
(58) Field of Search .............................. 327/74, 77, 64, 327/69, 71, 76, 82, 280

(56) References Cited

U.S. PATENT DOCUMENTS

| | | | |
|---|---|---|---|
| 4,034,268 A | | 7/1977 | Klauck ........................ 361/111 |
| 4,034,983 A | * | 7/1977 | Dash et al. ................ 273/85 R |
| 4,150,339 A | | 4/1979 | Sueyoshi et al. ........... 330/298 |
| 4,301,330 A | | 11/1981 | Trump ........................ 179/1 A |
| 5,488,306 A | * | 1/1996 | Bonaccio ..................... 324/539 |
| 5,488,323 A | * | 1/1996 | Beacham et al. ............. 327/74 |
| 6,124,746 A | * | 9/2000 | Van Zalinge ................ 327/280 |

FOREIGN PATENT DOCUMENTS

| | | | |
|---|---|---|---|
| EP | 0515853 A1 | 2/1992 | ............ H02G/7/20 |
| EP | 661802 A1 | 5/1995 | ............ H03F/1/52 |

* cited by examiner

Primary Examiner—Tuan T. Lam
Assistant Examiner—Hiep Nguyen
(74) Attorney, Agent, or Firm—Lisa K. Jorgenson; Allen, Dyer, Doppelt, Milbrath & Gilchrist, P.A.

(57) ABSTRACT

A method of assessing the offset on the output nodes of an amplifying channel includes generating a logic signal for signaling the existence of an offset having a level exceeding a window of permitted levels symmetric about the zero level. The window is defined by a negative limit value and by a positive limit value. The method includes establishing an interval or phase of detection by applying to an input of a detection circuit a timing pulse with a certain frequency, sensing the rising edge of the timing pulse and setting a bistable circuit, and comparing the signal on the output nodes of the amplifiers channel with the window of permitted values. The bistable circuit is reset upon the occurrence, after the initial setting, of an output signal amplitude within the window of permitted values. Failure of the bistable circuit to reset before the end of the detection phase signals an excessive offset.

40 Claims, 2 Drawing Sheets

METHOD OF ANOMALOUS OFFSET DETECTION AND A CORRESPONDING CIRCUIT

FIELD OF THE INVENTION

The present invention relates to integrated amplifiers, and, more particularly, to an audio amplifier and a technique of preventing irreversible damage to speakers and/or other components of an audio system.

BACKGROUND OF THE INVENTION

An excessive offset on the outputs of amplifying channels coupled to the respective speakers may cause serious damage, and may even destroy the speakers. This problem is particularly acute in audio systems installed in vehicles, in which a breakdown of de-coupling capacitors installed between the audio processor and the amplifier or an infiltration of moisture, may often generate an excessive offset on the output terminals of the amplifying channels. Consequently, the offset is present on the speaker or speakers connected to them.

Manufacturers of these apparatus are increasingly demanding automatic detecting devices for detecting anomalous offset conditions on the outputs of the amplifying channels. A number of techniques have been proposed that are commonly based on the use of large external capacitors for integrating the output signals of an amplifying channel and extracting an average value therefrom.

Because of space saving requirements and limitations on the number of pins of a power package, integration of the output signals is performed in common on all amplifying channels. This arrangement may not be desirable if, for example, two channels simultaneously develop an anomalous offset of opposite signs.

There is a need and/or usefulness for a more effective method of detecting anomalous offset conditions which, besides precluding erroneous detections and having a high speed of detection, may be implemented with circuits that may be easily integrated with a reduced silicon area requirement.

SUMMARY OF THE INVENTION

The present invention provides a method and circuit effectively fulfilling the above noted requirements.

The method comprises establishing an interval or phase on the order of tens of milliseconds to measure the offset by applying to an input of an offset detection circuit a pulse of the same duration of the established interval with a certain frequency of repetition. The rising edge of the input pulse is detected by setting a bistable circuit whose output generates a logic signal signaling the existence of an offset outside a certain window. The method further includes resetting the bistable circuit upon the occurrence, after the initial set and for the entire duration of the detection period, of a signal amplitude within the window on the output nodes of the amplifying channel.

The detection period, i.e., the pulse duration, may have a value equal to the period of an audio band signal of a frequency generally not less than 10 Hz. The detection interval may have a fixed or variable duration established by the microprocessor that controls the audio system, generally between 50 and 100 milliseconds. The bistable circuit, which is commonly an SR latch, is set by a rising edge detector at the beginning of each detection phase of the offset. The bistable circuit is eventually reset during the detection phase if no anomalies are detected.

Once maximum negative and positive limit thresholds of the offset are fixed in an absence of an audio signal during a phase in which the channel is in a play mode, any offset that may be present on the output nodes of the amplifying channel is compared with the fixed thresholds (positive and negative). If the offset exceeds any of the fixed thresholds at any time during the detection period, an output logic signal indicating an abnormally large offset is generated. Every time the amplifier is turned on, with the audio amplifier muted and in absence of input signals, the system's microprocessor may test the offset condition on the outputs of the various amplifying channels.

When the audio processor is in a play mode, there will be an audio signal fed to the input. The audio signal is summed to the offset on the output terminals of the amplifying channel. In this case, the detection of an anomalous offset condition would be required to hit a portion of the audio signal that has a sufficiently low amplitude such that during a whole detection interval, the sum of the signals on the output terminals (audio signal plus the offset) remains outside the window of tolerable values.

Indeed, the sum signal could remain inside the comparison notwithstanding an excessively large offset if opposite signs of the audio signal and the system would fail to detect the abnormal offset condition. However, it has been proven that for an interval of about 50–100 milliseconds, it is statistically extremely unlikely that a failure of the detection system would occur because the bandwidth of the audio signal is generally between 20 Hz and 20 KHz and, therefore, the audio signal crosses the zero level many times during a whole detection interval.

A particularly advantageous aspect of the method of the invention is its speed and effectiveness in detecting an anomalous condition as the offset increases towards dangerous levels. Moreover, it is possible with the method of the invention to command a continuous offset detection by simply imposing a frequency of repetition equivalent to the duration of the detection phase. This allows for a continuous check of the offset.

Naturally, both the detection period and the repeating frequency may be varied by the system's microprocessor. The rupture or failure of a coupling capacitor is one of the most dangerous causes of a suddenly excessive offset because a DC signal is directly applied to the input of the audio amplifier. For example, consider a DC output voltage of an audio processor supplied at 8V=2*V(aP), and V(Csvr) is equal to the ground reference potential of the audio amplifier. For a coupling capacitor to rupture or fail, the input of the audio amplifier receives an applied voltage equal to V(Csvr)−V(aP)>>7−4>>3V.

Assuming 3V*26db=90V, the output will be completely clipped (Voffset>12V). In such a case, the method of the invention after a first detection phase will signal the anomaly, thus indicating the existence of a rupture.

According to the present invention, an effective detecting circuit for detecting offset on the output nodes of an amplifying channel may include at least a bistable circuit having a reset input, a set input and an output coupled to a first input of a NOR gate. The NOR gate has a second input coupled to the input node for receiving a timing signal, and outputs a logic signal representative of the result of an offset detection phase.

The circuit further includes at least a rising edge detector having an input coupled to a source of the timing signal and an output coupled to the set input of the bistable circuit. A window comparator has inputs coupled to the output nodes of the amplifying channel, and an output coupled to a first input of a NAND gate. A second input of the NAND gate is coupled to the source of the timing signal, and an output is coupled to the reset input of the bistable circuit.

DETAILED DESCRIPTION OF THE PREFERRED EMBODIMENTS

Figure 1:
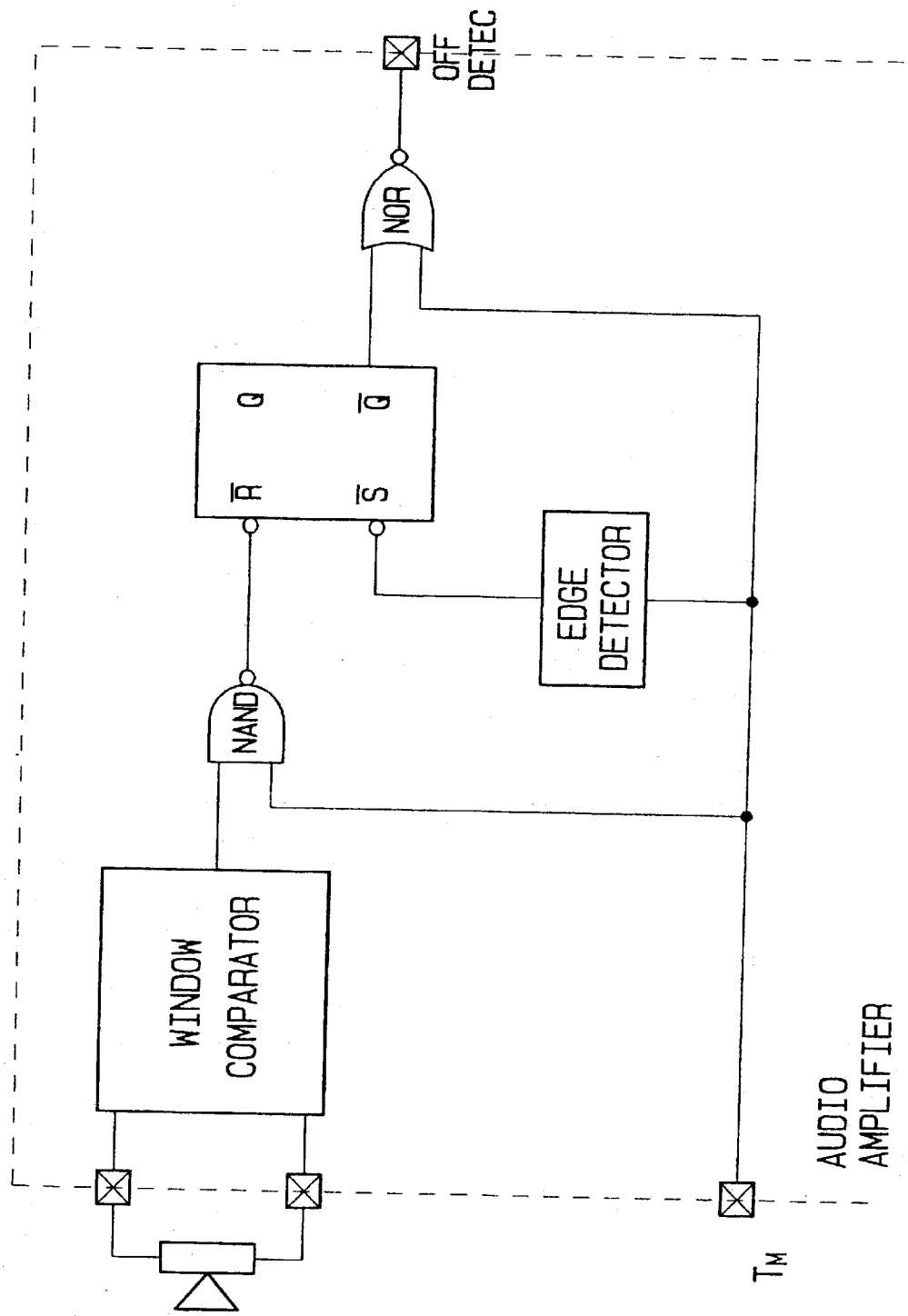
FIG. 1 is a high level functional block diagram of the circuit according to the present invention.

The block diagram shown in FIG. 1 depicts the circuit of the invention for detecting the offset, as it may be implemented in any conventional integrated device whose details are not shown in the figure. The scheme concerns a single amplifying channel and, if the integrated device comprises several amplifying channels, the circuit of the invention may be replicated for each amplifying channel as needed.

At a detection phase having a prefixed duration equivalent to the period of a signal in the audio band at a frequency not lower than 10 Hz, and generally between 50 and 100 milliseconds, a bistable circuit is reset whenever the signal amplitude on the output nodes of the amplifying channel is found to be inside a certain window of tolerable values. The tolerable values, which are symmetric about the zero level, are determined by a conventional WINDOW COMPARATOR. The bistable circuit is typically an SR latch that is set by an EDGE DETECTOR of a timing pulse Tm. The output nodes of the amplifying channel in the figure are connected to a speaker. If this does not occur, the output signal OFF DETECT switches, thus indicating that an anomalous offset has been detected.

The duration of the timing pulse Tm that fixes the detection interval is sufficient to substantially exclude spurious signaling of an anomaly during the normal functioning of the audio amplifier. This is because during the Tm interval the audio signal will almost certainly cross the zero level and, thus the output level will be checked for absence of an anomalous offset condition.

Such a problem of reliability of the detection will no longer exist in absence of an audio signal. A particularly effective characteristic of the system of the invention is that its ability to detect an anomalous (excessive) offset condition is further enhanced in coincidence with particularly dangerous conditions for the integrity of the audio system.

The higher the offset with respect to the fixed symmetric thresholds, the more the system tolerates it as long as in presence of a relatively higher audio signal amplitude for an enhanced ability to correctly discriminate a real anomaly.

Figure 2:
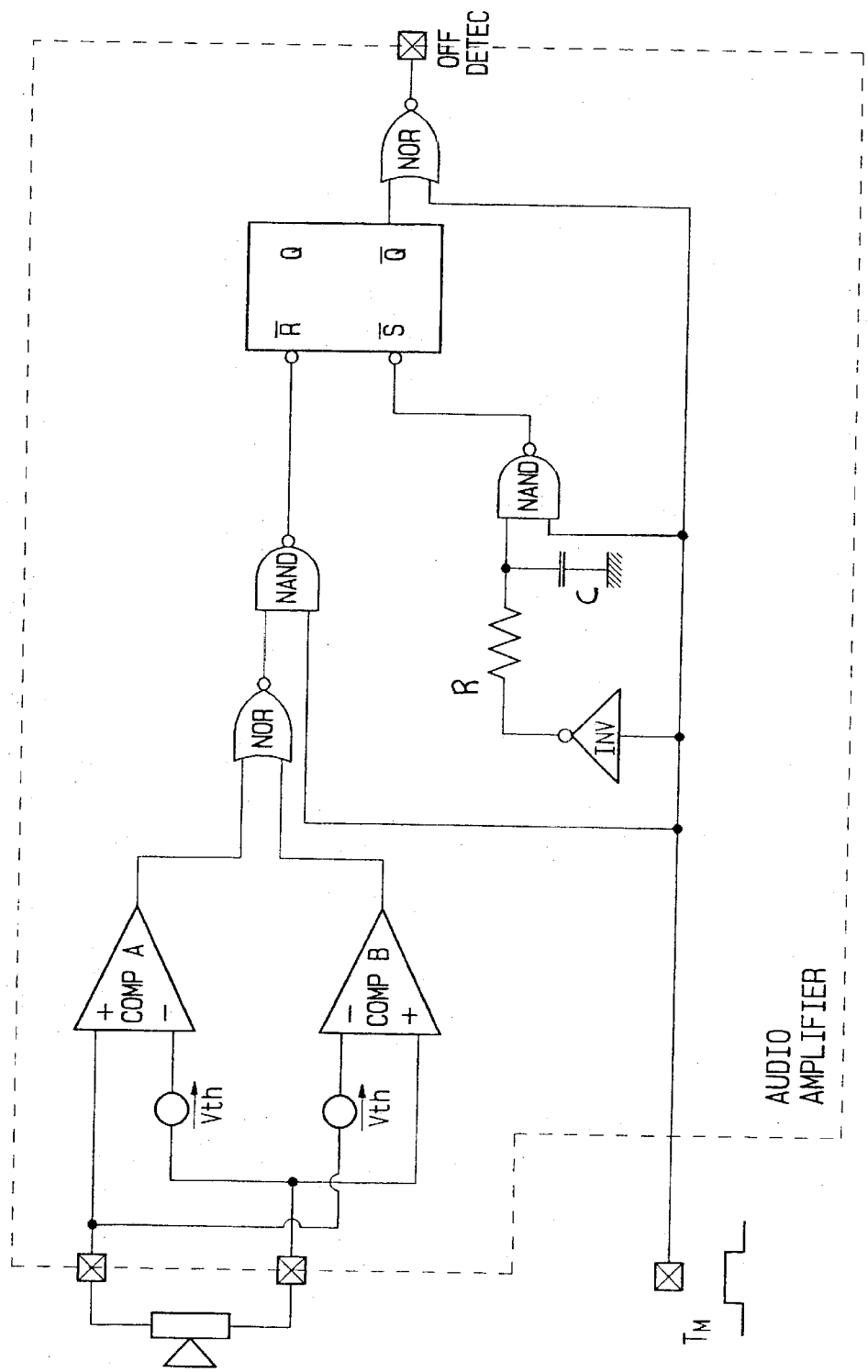
FIG. 2 is a more detailed circuit diagram of the functional block diagram illustrated in FIG. 1.

FIG. 2 shows a detection circuit according to the present invention. The window comparator may be formed conventionally by a pair of comparators with the same prefixed threshold Vth, namely CompA and CompB, inverting inputs (−) and noninverting inputs (+) of which are cross-coupled to the two output nodes of the amplifying channel (connected to a respective speaker) as shown in the figure. The outputs of the two comparators are combined by the NOR gate for producing a logic signal that represents the result of the comparison.

The EDGE DETECTOR may be formed as illustrated and may include the inverter INV, the RC network and the NAND gate. In general, the system may require two pins, one to feed the timing signal Tm and the other to make available the output logic signal OFF DETECT signaling the offset condition. Alternatively, both the input signal Tm and the output signal OFF DETECT may be conveyed via a digital bus protocol, such as an I2Cbus, for example.

Commonly, the OFF DETECT signal produced by the detection system will be read by the microprocessor that controls the entire audio system, and which may consequently execute appropriate commands through an I2Cbus control bus. If an excessive offset is signaled on a channel, the microprocessor may, for example, command the muting of that channel.

The system's microprocessor may impose a certain detection interval by varying the duration of the Tm pulse and/or the frequency thereof according to a specific control software. Of course, the microprocessor may also adopt certain criteria to interpret the information derived from the OFF DETECT signal. For example, it may decide that a certain audio channel presents an anomalous or excessive offset if the OFF DETECT signal is raised three times in succession upon the performance of as many detecting phases.

The system of the invention requires the integration of comparators and of conventional digital components, all relatively easy to integrate and requiring a limited silicon space. In contrast, the known approaches require complex digital or analog filters for extracting a DC component (i.e., below about 20 Hz) from the output signal of the channel. In order to filter and read the DC component of the outputs signals numerous pins are normally required. By comparison, the approach of the present invention is highly reliable and can be implemented at an exceptionally low cost.

That which is claimed is:

1. A method for assessing an offset on an output of an amplifier, the method comprising:
    establishing an interval of detection by applying a timing pulse to an input of a detection circuit;
    sensing a rising edge of the timing pulse and setting a bistable circuit responsive thereto;
    comparing an output signal on the output of the amplifier with a window of permitted values during the interval of detection, the window of permitted values being defined by a lower limit and by an upper limit;
    resetting the bistable circuit if the output signal has an amplitude within the window of permitted values during the interval of detection; and
    generating a logic signal signaling an excessive offset if the output signal has an amplitude outside the window of permitted values during the interval of detection.

2. A method according to claim 1, wherein the lower limit and the upper limit are symmetric about a zero level.

3. A method according to claim 1, wherein duration of the interval of detection is equivalent to a period of an audio band signal having a frequency not lower than 10 Hz.

4. A method according to claim 3, wherein the period is between about 50 and 100 milliseconds.

5. A method according to claim 1, further comprising varying a frequency of the timing pulse for varying the interval of detection.

6. A method according to claim 1, further comprising varying duration of the timing pulse for varying the interval of detection.

7. A method according to claim 1, wherein the bistable circuit comprises an S-R latch.

8. A method according to claim 1, wherein the output of the amplifier is connected to a speaker.

9. A method for determining an excessive offset on an output of an amplifier, the method comprising:
    establishing an interval of detection by applying a timing pulse to an input of a detection circuit;
    sensing a first edge of the timing pulse and setting a bistable circuit responsive thereto;
    comparing an output signal on the output of the amplifier with a window of permitted values during the interval of detection, the window of permitted values defined by at least one limit; and generating a logic signal signaling the excessive offset if the output signal has an amplitude outside the window of permitted values during the interval of detection.

10. A method according to claim 9, further comprising resetting the bistable circuit if the output signal has an amplitude within the window of permitted values during the interval of detection.

11. A method according to claim 9, wherein the first edge is a rising edge of the timing pulse.

12. A method according to claim 9, wherein the at least one limit includes a lower limit and an upper limit.

13. A method according to claim 12, wherein the lower and upper limits are symmetric about a zero level.

14. A method according to claim 9, wherein duration of the interval of detection is equivalent to a period of an audio band signal having a frequency not lower than 10 Hz.

15. A method according to claim 14, wherein the period is between about 50 and 100 milliseconds.

16. A method according to claim 9, further comprising varying a frequency of the timing pulse for varying the interval of detection.

17. A method according to claim 9, further comprising varying duration of the timing pulse for varying the interval of detection.

18. A method according to claim 9, wherein the bistable circuit comprises an S-R latch.

19. A method according to claim 9, wherein the output of the amplifier is connected to a speaker.

20. A circuit for assessing offset of an output of an amplifier, the circuit comprising:
- a detection circuit having an input for detecting a rising edge of the timing pulse, the timing pulse establishing an interval of detection;
- a window comparator having inputs connected to the output of the amplifier, said window comparator for comparing an output signal on the output of the amplifier with a window of permitted values during the interval of detection, the window of permitted values defined by a first limit and by a second limit;
- a NAND gate having a first input connected to an output of said window comparator, a second input for receiving the timing pulse;
- a bistable circuit having a reset input connected to an output of said NAND gate, and a set input connected to an output of said detection circuit; and
- a NOR gate having a first input connected to an output of said bistable circuit, a second input for receiving the timing pulse, and an output for providing a logic signal signaling an excessive offset if the output signal has an amplitude outside the window of permitted values during the interval of detection.

21. A circuit according to claim 20, wherein the output of the amplifier includes a pair of output nodes, and said window comparator comprises:
- a pair of comparators having respective inverting and noninverting inputs cross-connected to the pair of output nodes; and
- an output NOR gate having inputs connected to respective outputs of said pair of comparators.

22. A circuit according to claim 20, wherein said pair of comparators have a same threshold.

23. A circuit according to claim 20, wherein the first limit corresponds to a lower limit and the second limit corresponds to an upper limit.

24. A circuit according to claim 23, wherein the lower and upper limits are symmetric about a zero level.

25. A circuit according to claim 20, wherein duration of the offset detection phase is equivalent to a period of an audio band signal having a frequency not lower than 10 Hz.

26. A circuit-according to claim 25, wherein the period is between about 50 and 100 milliseconds.

27. A circuit according to claim 20, wherein the bistable circuit comprises an S-R latch.

28. A circuit according to claim 20, wherein the output of the amplifier is connected to a speaker.

29. An audio amplifier comprising:
- at least one amplifier output;
- at least one circuit connected to said at least one amplifier output for assessing offset thereon, said at least one circuit comprising
  - a detection circuit having an input for detecting a rising edge of the timing pulse, the timing pulse establishing an interval of detection,
  - a window comparator having inputs connected to said at least one amplifier output, said window comparator for comparing an output signal on said at least one amplifier output with a window of permitted values during the interval of detection, the window of permitted values defined by at least one limit,
  - a first logic gate having a first input connected to an output of said window comparator, a second input for receiving the timing pulse,
  - a bistable circuit having a reset input connected to an output of said first logic gate, and a set input connected to an output of said detection circuit, and
  - a second logic gate having a first input connected to an output of said bistable circuit, a second input for receiving a timing pulse, and an output for providing a logic signal signaling an excessive offset if the output signal has an amplitude outside the window of permitted values during the interval of detection.

30. An audio amplifier according to claim 29, wherein said at least one amplifier output includes a pair of output nodes, and wherein said window comparator comprises:
- a pair of comparators having respective inverting and noninverting inputs cross-connected to the pair of output nodes; and
- an output NOR gate having inputs connected to respective outputs of said pair of comparators.

31. An audio amplifier according to claim 29, wherein said pair of comparators have a same threshold.

32. An audio amplifier according to claim 29, wherein the first logic gate comprises a NOR gate.

33. An audio amplifier according to claim 29, wherein the first edge of the timing pulse comprises a rising edge.

34. An audio amplifier according to claim 29, wherein the second logic gate comprises a NAND gate.

35. An audio amplifier according to claim 29, wherein the at least one limit includes a lower limit and an upper limit.

36. An audio amplifier according to claim 35, wherein the lower and upper limits are symmetric about a zero level.

37. An audio amplifier according to claim 29, wherein duration of the offset detection phase is equivalent to a period of an audio band signal having a frequency not lower than 10 Hz.

38. An audio amplifier according to claim 37, wherein the period is between about 50 and 100 milliseconds.

39. An audio amplifier according to claim 29, wherein said bistable circuit comprises an S-R latch.

40. An audio amplifier according to claim 29, wherein said at least one amplifier output is connected to a speaker.

* * * * *